United States Patent
Yu

(10) Patent No.: US 6,580,252 B1
(45) Date of Patent: *Jun. 17, 2003

(54) BOOST CIRCUIT WITH NORMALLY OFF JFET

(75) Inventor: Ho-Yuan Yu, Saratoga, CA (US)

(73) Assignee: Lovoltech, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/877,351

(22) Filed: Jun. 7, 2001

Related U.S. Application Data

(63) Continuation-in-part of application No. 09/430,500, filed on Oct. 29, 1999, now Pat. No. 6,251,716, and a continuation-in-part of application No. 09/708,336, filed on Nov. 7, 2000.

(51) Int. Cl.$^7$ .......................... G05F 1/652; G05F 1/656; G05F 1/613
(52) U.S. Cl. .................. 323/222; 323/223; 323/282; 323/288
(58) Field of Search .................. 323/222, 223, 323/288, 282

(56) References Cited

U.S. PATENT DOCUMENTS

| | | | | |
|---|---|---|---|---|
| 5,180,964 A | * | 1/1993 | Ewing | 323/222 |
| 5,410,467 A | * | 4/1995 | Smith et al. | 363/131 |
| 6,356,059 B1 | * | 3/2002 | Yu | 323/223 |

OTHER PUBLICATIONS

Sedra & Smith, Microelectronics Circuits, 1998, 4th edition, Oxford University Press, pp. 447–450.*

* cited by examiner

Primary Examiner—Bao Q. Vu
(74) Attorney, Agent, or Firm—Wagner, Murabito & Hao LLP

(57) ABSTRACT

An enhancement mode JFET as a switching device in a boost converter circuit combined with a single rectifier diode and an inductor. A control circuit coupled to the gate of the JFET switches the JFET between a current conducting state and a current blocking state. The ratio of converter dc output voltage to converter dc input voltage is determined by the ratio of JFET conducting time to the sum of JFET conducting time and JFET blocking time. This pulse width modulation scheme is thus used to adjust the dc output voltage level. Limits on both frequency of operation and duty cycle result from slow switching speeds. Each time a device switches between states, a certain amount of energy is lost. The slower the device switching time, the greater the power loss in the circuit. The effects become very important in high frequency (fast switching) and/or high power circuits where as much as 50% of the losses are due to excessive switch transition time. The enhancement mode JFET is an excellent switch since it has a very small internal resistance between source and drain in the conducting state as well as a very small terminal voltage. As a result, very little power is dissipated in the JFET itself. Furthermore, the current carriers in the JFET are all majority carriers which results in very short switching transition times. As a result, the present invention offers significant improvements over existing circuits in high frequency switching as well as high power applications.

19 Claims, 6 Drawing Sheets

BOOST CIRCUIT WITH NORMALLY OFF JFET

RELATED APPLICATIONS

The following copending U.S. patent application is a continuation-in-part of Ser. No. 09/430,500, "NOVEL JFET STRUCTURE AND MANUFACTURE METHOD FOR LOW ON RESISTANCE AND LOW VOLTAGE APPLICATIONS", Ho-Yuan Yu, filed Oct. 29, 1999, now U.S. Pat. No. 6,251,716 is incorporated herein by reference for all purposes. The following copending U.S. patent application is a continuation-in-part of Ser. No. 09/708,336, "STARTER DEVICE FOR NORMALLY "OFF" JFETS", Ho-Yuan Yu, filed Nov. 7, 2000, is incorporated herein by reference for all purposes.

BACKGROUND OF THE INVENTION

1. Field of the Invention

The present invention relates to the field of direct current (dc) power supplies designed for converting a given dc voltage to another dc voltage or dc current. More particularly, the present invention relates to utilization of enhancement mode Junction Field Effect Transistors (JFET) to construct dc-dc converters commonly known as boost converters.

2. Related Art

Modern electronic circuit applications frequently require dc power supplied at several different voltage levels. It is often desirable to produce multiple dc voltage levels from a single dc voltage source by means of electronic circuits. This is particularly true in portable equipment Where batteries are utilized either as the primary source of electrical energy or as the backup power source. Laptop computers, Personal Digital Assistants (PDA), pagers and cell phones all have such requirements. In a class of electronic circuits known as dc-dc converters, electric energy is transferred between two dc circuits operating at different voltage and current levels. Included in these circuits are the buck converter, the boost converter, and the buck-boost converter.

The boost converter is a direct switching circuit for converting input dc current to output dc voltage. The boost converter is used in a wide range of circuit applications including dc motor controllers and switching power supplies. The output voltage of the boost converter is always equal to or greater than an input or source voltage. The basic circuit is a two-port network having a pair of input terminals and a pair of output terminals. The single dc power source is connected across the two input terminals and a dc load is connected across the two output terminals. Within the two-port, the ideal circuit consists of two switching devices, appropriate control circuitry for the two switching devices, and a single inductor.

An ideal switching device has an on state and an off state. In the on state, a device conducts an electric current between two terminals with zero voltage drop across the terminals. In the off state, a device will support any voltage drop across two terminals while conducting zero current between the two terminals. A number of different electronic devices are used as switches in boost converters, all of which depart from the ideal in one or more respects. Some examples of such devices include semiconductor diodes, bipolar junction transistors (BJT), field effect transistors (FET), and silicon controlled rectifiers (SCR). In the boost converter circuit, the ratio of output voltage to input voltage is frequently limited due to the forward voltage drop across the terminals of one or both of the switching devices.

Another major concern with conventional switching devices is the non-zero voltage between the two current conducting terminals while in the on state. The result is power dissipation in the switching device with excessive heat generation and a reduction in overall circuit efficiency. A second major concern stems from the dynamic behavior of the switching devices. That is, the speed with which a device will transition between the on and the off states. Limits on both frequency of operation and duty cycle result from slow switching speeds. Every time a device switches between states, a certain amount of energy is lost. The slower the device switching time, the greater the power loss in the circuit. The effects become very important in high frequency (fast switching) and/or high power circuits where as much as 50% of the losses are due to excessive switching transition time.

SUMMARY OF THE INVENTION

Accordingly, what is needed is a switching device useful in dc power supply circuits that will approach the operation of an ideal switching device. What is further needed is a switching device that has close to zero volts across its conduction terminals while in the on or current conducting state. What is also needed is a switching device that is capable of operating in switching power supplies at higher operating frequencies by virtue of very short transition times between states. What is needed yet is a switching device having very low terminal voltage in the on state and very short transition times between states that can be used in high power circuits. The present invention provides these advantages and others not specifically mentioned above but described in the sections to follow.

An enhancement mode JFET as a switching device in a boost converter circuit combined with a single rectifier diode and an inductor. A control circuit coupled to the gate of the JFET switches the JFET between a current conducting state and a current blocking state. The ratio of converter dc output voltage to converter dc input voltage is determined by the ratio of JFET conducting time to the sum of JFET conducting time and JFET blocking time. This pulse width modulation scheme is thus used to adjust the dc output voltage level.

Limits on both frequency of operation and duty cycle result from slow switching speeds. Each time a device switches between states, a certain amount of energy is lost. The slower the device switching time, the greater the power loss in the circuit. The effects become very important in high frequency (fast switching) and/or high power circuits where as much as 50% of the losses are due to excessive switch transition time.

The enhancement mode JFET is an excellent switch since it has a very small internal resistance between source and drain in the conducting state as well as a very small terminal voltage. As a result, very little power is dissipated in the JFET itself. Furthermore, the current carriers in the JFET are all majority carriers which results in very short switching transition times. As a result, the present invention offers significant improvements over existing circuits in high frequency switching as well as high power applications.

In one embodiment of the present invention, a boost converter using a normally off JFET is constructed in the form of a two-port network. The negative input terminal is electrically connected to the negative output terminal to form a common ground. A dc power source is connected across the terminals of the input port. A normally off, or enhancement mode, n-channel JFET is used as a switching device with drain connected to the common ground and source connected to an internal common node. Control circuitry within the two-port applies a switching control signal to the gate of the JFET. The internal circuit consists of a semiconductor diode, an inductor and a capacitor. The anode of the diode is connected to the internal common node and the cathode is connected to the positive output terminal. The inductor is connected between the internal common node and the positive input terminal. The capacitor is connected across the output terminals. The JFET has very low terminal voltage source to drain when in the on or conducting state. That is to say, the JFET has a very small internal resistance between source and drain in the on state. The current carriers in the JFET are all majority carriers which results in very short switching transition times. As a result, this circuit offers significant improvements over existing circuits in high frequency switching as well as high power applications.

In a second embodiment, an n-channel enhancement mode and a p-channel enhancement mode JFET are used as switching devices in a boost converter circuit. The circuit topology is the same as the first configuration with the diode replaced by the p-channel JFET. The p-channel JFET is connected with source to the common internal node and drain to the positive output terminal. The gates of the two JFETs are connected together, and a switching signal is applied to the gates by means of an internal control circuit. Both JFETs have a very low terminal voltage source to drain when in the on or conducting state. That is to say, each JFET has a very small internal resistance between source and drain in the on state. The current carriers in the JFETs are all majority carriers which results in very short switching transition times. As a result, this circuit also offers significant improvements over existing circuits in high frequency switching as well as high power applications.

For both configurations, the internal switching control circuitry can be realized with simple current control to vary both frequency and duty cycle. Furthermore, high frequency applications can be accomplished without the need for complex zero voltage switching, zero current switching or synchronous rectifying circuitry.

DETAILED DESCRIPTION OF THE INVENTION

In the following detailed description of the present invention, a boost circuit with normally off JFET, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
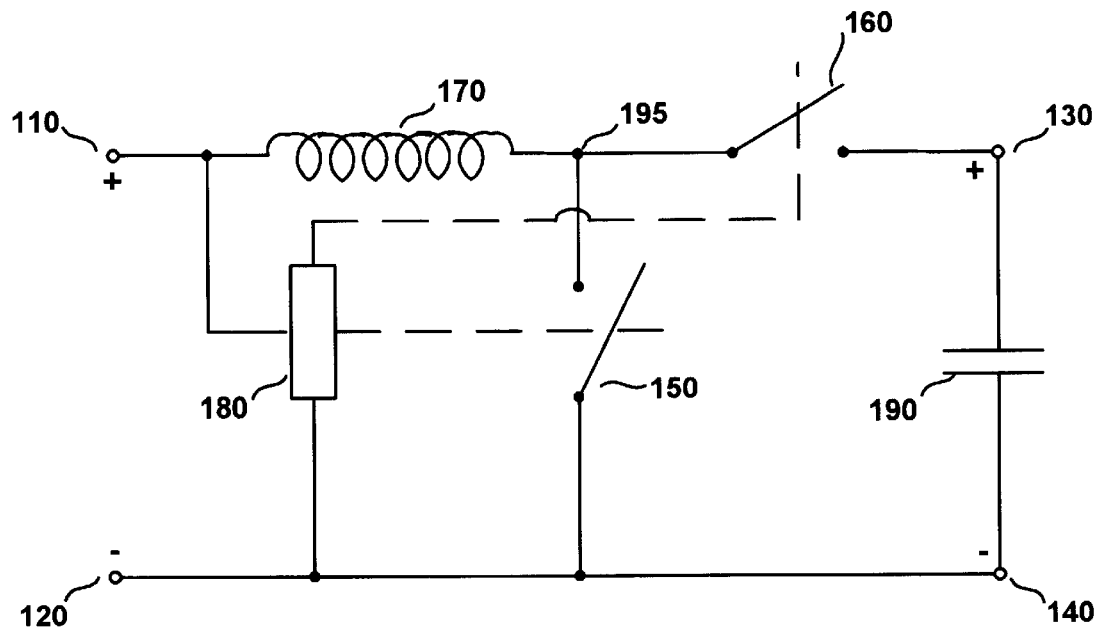
FIG. 1 is a generic diagram of a dc-dc boost converter circuit.

The generic diagram for a dc-dc boost converter circuit 100 is shown in FIG. 1 as a two-port network having a positive input terminal 110, a positive output terminal 130, and a negative input terminal 120 connected to a negative output terminal 140. In order to function properly, an electrical load 190 must be placed across the output terminals. A first switch 150 is connected between the common negative input terminals 120 and 140, and an internal node 195. A second switch 160 is connected between the internal node 195 and the positive output terminal 130. Both switches are operated by a control circuit 180 such that one switch is always open. A single inductor 170 is connected between the positive input terminal 110 and the internal node 195.

The circuit has two operating states according to the positions of the two switches. The control circuit continually switches the circuit back and forth between the two states. In the first state, switch 150 is closed while switch 160 is open. In this state, a dc current is established in the inductor which then acts as an energy storage element. In the second state, switch 150 is open while switch 160 is closed. In this state, the inductor acting as a current source tends to maintain the dc current through the load. By these means, a dc voltage applied at the input terminals will result in a dc voltage of equal or greater value across the output terminals. The actual value of the dc output voltage can be controlled by the time switch 150 is closed relative to the time it is open. With switch 150 held open and switch 160 held closed, the dc output voltage will equal the dc input voltage. Under switching action, with switch 150 alternately closed and open, the dc output voltage will be equal to or greater than the dc input voltage. Holding switch 160 open while switch 150 is closed will eventually result in a zero output voltage.

Figure 2:
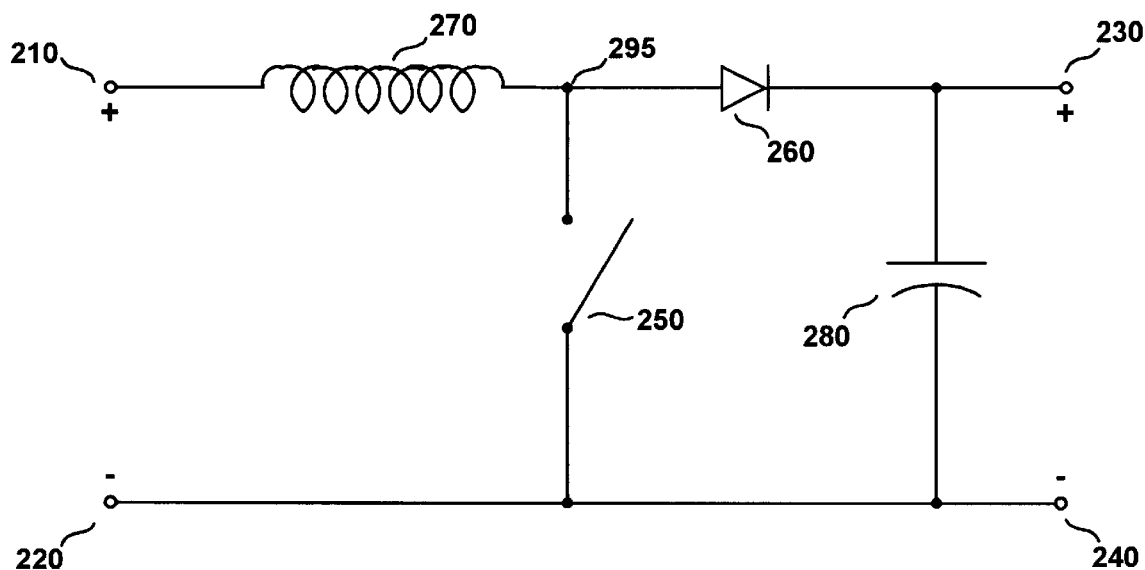
FIG. 2 is the generalized topology for a dc-dc boost converter circuit using a single switch and a rectifier diode.

FIG. 2 is the generalized topology for a dc-dc boost converter circuit 200 using a single switch 250 and a rectifier diode 260. The circuit is shown as a two-port network having a positive input terminal 210, a positive output terminal 230 and a negative input terminal 220 connected to a negative output terminal 240. The switch is connected between the negative terminals 220, 240 and an internal node 295. The anode of the diode is connected to the internal node 295 and the cathode is connected to the common negative terminals 220 and 240. An inductor 270 is connected between the positive input terminal and the anode of the diode. A capacitor 280 acts as an electrical load placed across the output terminals.

This circuit has two operating states according to whether the switch is open or closed. In the first state, the switch is closed and a dc current is established in the inductor which then acts as an energy storage element. When the switch is closed, the diode is reverse biased and thus acts as an open switch blocking any current through it. In the second state, the switch is open and the inductor acting as a current source tends to maintain the dc current through the load. In this state, the diode is forward biased and thus acts as a closed switch to conduct current. By these means, a dc voltage applied at the input terminals will result in a dc voltage of equal or greater value across the output terminals. The actual value of the dc output voltage can be controlled by the time the switch is closed relative to the time it is open. With the switch held open, the dc output voltage will be equal to the dc input voltage. Under switching action, with the switch alternately closed and open, the dc output voltage will be equal to or greater than the dc input voltage. Holding the switch closed will eventually result in a zero output voltage.

Figure 3:
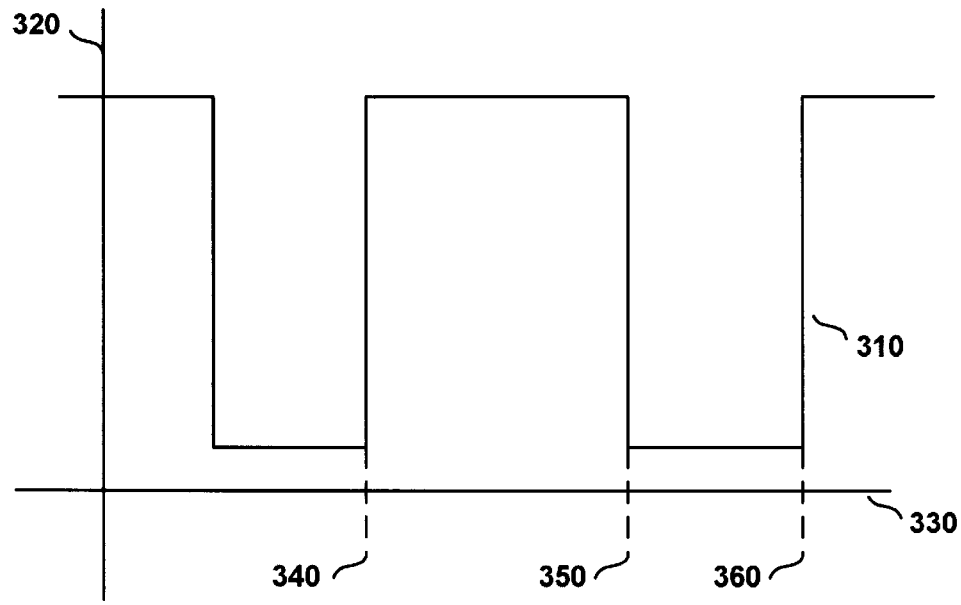
FIG. 3 is an exemplary pulse width modulated control waveform for holding switches in a current conducting state or in a current blocking state.

FIG. 3 is an exemplary pulse width modulated control waveform 300 for holding a switch in a current conducting state or in a current blocking state. The vertical scale 320 may be either a current or a voltage, and the horizontal scale 330 is in units of time. The waveform 310 is periodic with time period measured from point 340 to point 360. The high waveform level is measured from point 340 to point 350, while the low waveform level is measured from point 350 to point 360. The waveform can be considered a series of positive pulses, each positive pulse being measured from point 340 to point 350. Alternately, the waveform can be considered a series of negative pulses, each negative pulse being measured from point 350 to point 360. Either the positive pulse or the negative pulse can be used to change the state of a switch between a current conducting state or a current blocking state according to the characteristics of the switch. The dc component of the waveform is proportional to pulse width which in turn is proportional to the dc output voltage level. That is, the ratio of positive pulse time to time period or the ratio of negative pulse time to time period is proportional to the dc output voltage level. Thus, modulating the pulse width is a means for controlling the dc output voltage level. Reducing the width of the negative pulses to zero will produce a waveform held at the high level which will result in an output voltage that is either zero or equal to the dc input voltage. Reducing the width of the positive pulses to zero will produce a waveform held at the low level which will result in an output voltage that is either zero or equal to the dc input voltage.

Figure 4:
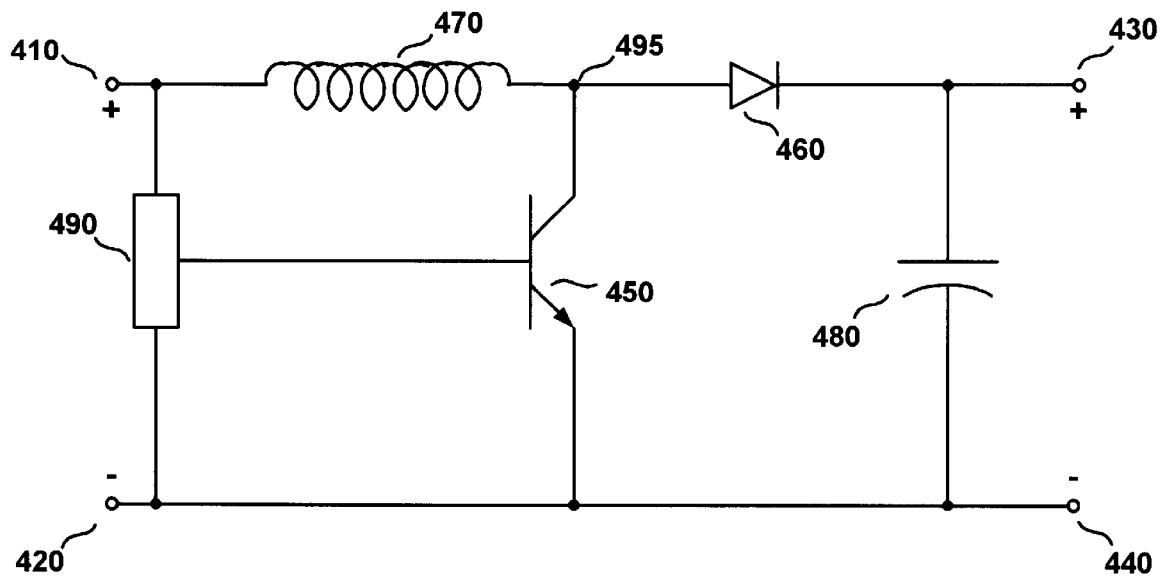
FIG. 4 is a circuit diagram for a prior art dc-dc boost converter using a single MOSFET.

FIG. 4 is a circuit diagram 400 for a prior art dc-dc boost converter using a single BJT 450 as a switch and a rectifier diode 460. The circuit is shown as a two-port network having a positive input terminal 410, a negative input terminal 420, a positive output terminal 430 and a negative output terminal 440. An inductor 470 is connected between the positive input terminal and the anode of the diode which forms an internal node 495. A capacitor 480 acts as an electrical load placed across the output terminals. A control circuit 490 is connected between the input terminals 410 and 420 for electrical power, and is coupled to the base lead of the BJT for switching the BJT between current conducting and current blocking states. The control circuit is operated as a pulse width modulator and thus controls the level of the dc output voltage.

Figure 5:
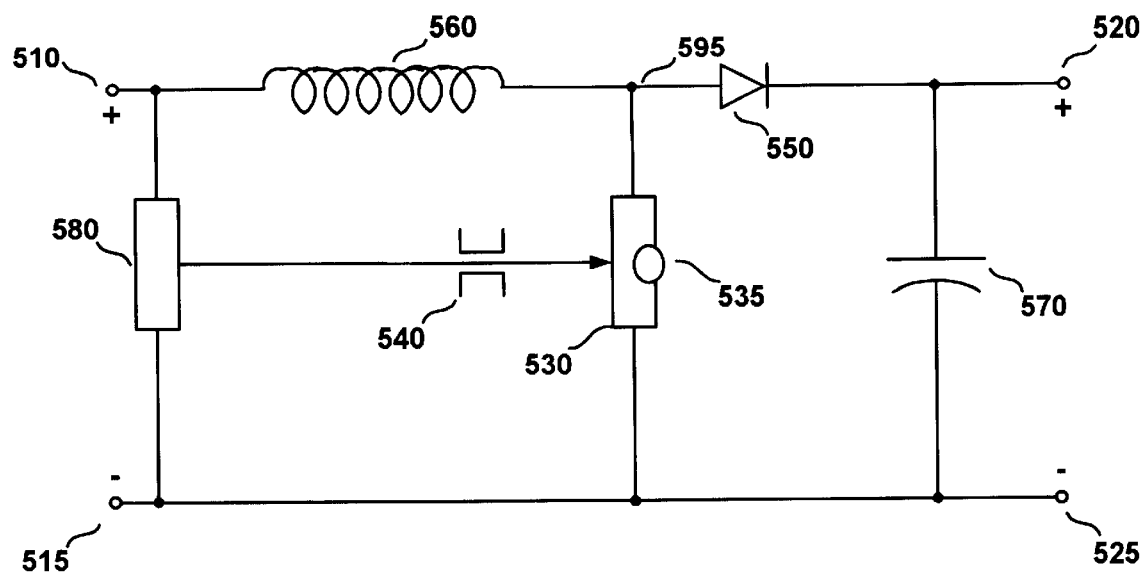
FIG. 5 is a circuit diagram for a dc-dc boost converter using a single n-channel enhancement mode JFET according to the present invention.

FIG. 5 is a circuit diagram 500 for a dc-dc boost converter using a single n-channel enhancement mode JFET 530, as described in copending U.S. patent application Ser. No. 09/708,336, "STARTER DEVICE FOR NORMALLY "OFF" JFETS", Ho-Yuan Yu, filed Nov. 7, 2000, as a switch, and a rectifier diode 550 according to the present invention. In this first embodiment, the circuit is shown as a two-port network having a positive input terminal 510, a positive output terminal 520, and a negative input terminal 515 connected to a negative output terminal 525. An inductor 560 is connected between the positive input terminal and an internal node 595. The anode of the diode is connected to the internal node 595 and the diode cathode is connected to the positive output terminal 520. A capacitor 570 acts as an electrical load placed across the output terminals 520 and 525. The JFET source and drain are connected between the common negative terminals 515 and 525, and the internal node 595.

A starter device 535 may be connected between source and drain of the JFET. This starter device can be built in to the enhancement mode JFET either by the add on module or by parasitic structure. A control circuit 580 is coupled to the gate lead of the JFET for switching between current conducting and current blocking states. A current limiting device 540 may be connected in series between the control circuit and the gate lead of the JFET for gate protection.

With the JFET in a current conducting state, a voltage source connected across the input terminals 510 and 515 causes a dc current in a path entering the positive input terminal 510, passing through the inductor and the JFET, and returning to the voltage source by the negative input terminal 515. In this state, energy from the input voltage source is stored in the inductor which tends to behave as a constant current source. With the JFET in the current blocking state, the energy stored in the inductor causes a dc current in a path beginning at the positive input terminal 510, passing through the inductor and the diode, into the capacitor and out the positive output terminal 520 through any connected load, into the negative output terminal 525 and out the negative input terminal 515 through the input voltage source to the positive input terminal 510. The control circuit is operated as a pulse width modulator and thus controls the level of the dc output voltage which can be equal to or greater than the source voltage connected across the input terminals.

The control waveform applied to the gate lead of the JFET can be considered a series of positive pulses in which a positive pulse switches the JFET into a current conducting state. The dc output voltage is then proportional to the ratio of the positive pulse time to the waveform period time. Holding the waveform in the low state holds the JFET in a current blocking state which results in a dc output voltage equal to the dc input source voltage. Holding the waveform in the high state holds the JFET in a current conducting state which results in a zero dc output voltage. It is to be appreciated that a similar dc-dc boost converter circuit is realizable using a p-channel enhancement mode JFET and appropriate changes in the control waveform.

Figure 6:
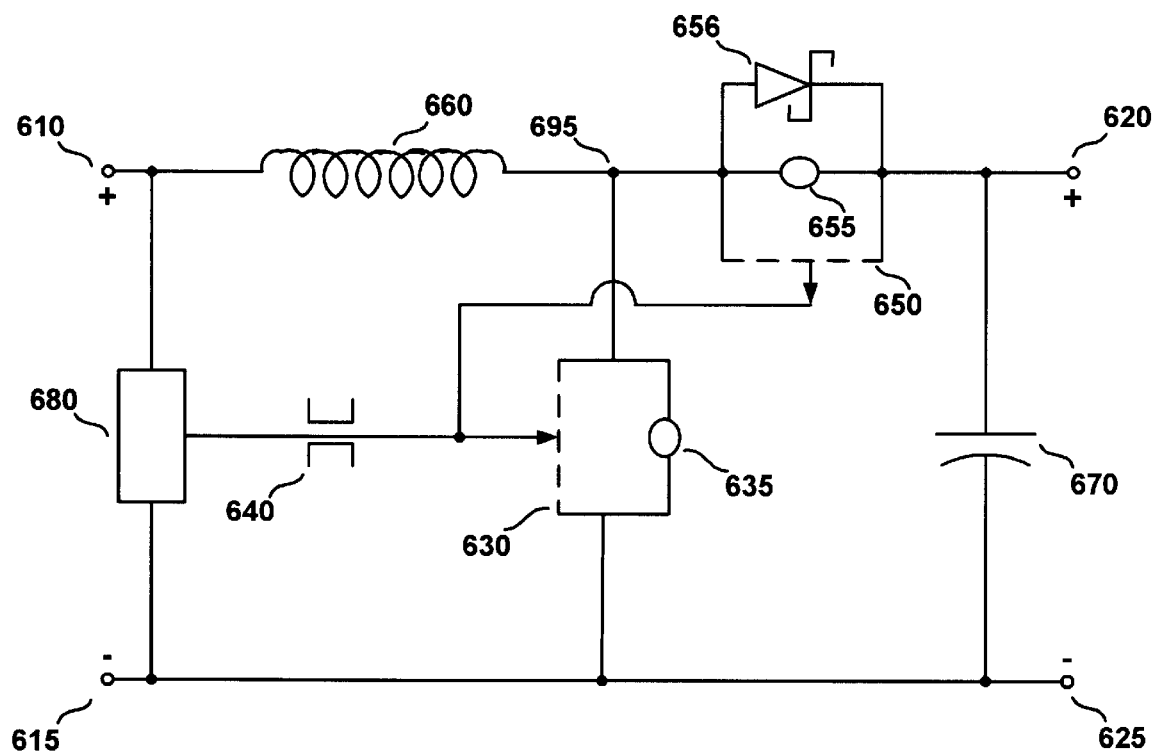
FIG. 6 is a circuit diagram for a dc-dc boost converter using a single n-channel enhancement mode JFET and a single p-channel enhancement mode JFET according to the present invention.

FIG. 6 is a circuit diagram 600 for a dc-dc boost converter using an n-channel enhancement mode JFET 630 as a first switch and a p-channel enhancement mode JFET 650 as a second switch according to the present invention. In this second embodiment, the circuit is shown as a two-port network having a positive input terminal 610, a positive output terminal 620, and a negative input terminal 615 connected to a negative output terminal 625. An inductor 660 is connected between the positive input terminal and an internal node 695. A capacitor 670 acts as an electrical load placed across the output terminals 620 and 625. The n-channel JFET source and drain are connected between the common negative terminals 615 and 625 and the internal node. The p-channel JFET source and drain are connected between the output negative terminal 620 and the internal node 695.

Starter devices 635 and 655 can be connected between source and drain of the n-channel JFET and the p-channel JFET respectively. A control circuit 680 is coupled to the gate leads of both JFETs for switching them between current conducting and current blocking states. A current limiting device 640 can be connected in series between the control circuit and the gate leads of the JFETs for gate protection. The control circuit will ensure that when one JFET is in a conducting state the other JFET will be in a non-conducting state.

With the n-channel JFET 630 in a current conducting state, a voltage source connected across the input terminals 610 and 615 causes a dc current in a path entering the positive input terminal 610, passing through the inductor and the n-channel JFET 630, and returning to the voltage source by the negative input terminal 615. In this state, energy from the input voltage source is stored in the inductor which tends to behave as a constant current source. During this time, the p-channel JFET 650 will be in a non-conducting state.

With the p-channel JFET 650 in the current conducting state, the energy stored in the inductor causes a dc current in a path beginning at the positive input terminal 610, passing through the inductor and the p-channel JFET 650, into the capacitor and out the positive output terminal 620 through any connected load, into the negative output terminal 625 and out the negative input terminal 615 through the input voltage source to the positive input terminal 610. During this time, the n-channel JFET 630 will be in a non-conducting state. The Schottky diode 656 will provide a current path whenever JFET 630 is off.

The control waveform applied to the gate leads of the JFETs can be considered a series of positive pulses in which a positive pulse switches the n-channel JFET into the current conducting state, and simultaneously switches the p-channel JFET into the current blocking state. The dc output voltage is then proportional to the ratio of the positive pulse time to the waveform period time. Holding the waveform in the low state holds the n-channel JFET in a current blocking state which results in a dc output voltage equal to the dc input source voltage. Holding the waveform in the high state holds the n-channel JFET in a current conducting state which eventually results in a zero dc output voltage. It is to be appreciated that a similar dc-dc boost converter circuit is realizable by interchanging the positions of the n-channel and p-channel JFETs with appropriate changes in the control waveform.

For both configurations, the internal switching control circuitry can be realized with simple current control to vary both frequency and duty cycle. Furthermore, high frequency applications can be accomplished without the need for complex zero voltage switching, zero current switching or synchronous rectifying circuitry.

The preferred embodiment of the present invention, a boost converter with normally off JFET, is thus described. While the present invention has been described in particular embodiments, it should be appreciated that the present invention should not be construed as limited by such embodiments, but rather construed according to the below claims.

What is claimed is:

1. A boost converter circuit comprising:
    a) at least one enhancement mode JFET;
    b) an inductor coupled to the input;
    c) a current rectifying device, and
    d) a control circuit.

2. A boost converter circuit according to claim 1 wherein said control circuit is for switching said JFET between a current blocking state and a current conducting state.

3. A boost converter circuit according to claim 1 wherein said control circuit is for determining the frequency at which said JFET is switched between a current blocking state and a current conducting state.

4. A boost converter circuit according to claim 1 wherein the ratio of dc output voltage to dc input voltage is determined by the ratio of said JFET current conducting time to the sum of said JFET current conducting time and said JFET current blocking time.

5. A boost converter circuit comprising:
    a) a two-port network comprising a positive input terminal; a positive output terminal, and a negative terminal common to the input and the output;
    b) an enhancement mode Junction Field Effect Transistor (JFET) coupled with source and drain between said negative terminal and an inductor;
    c) said inductor coupled between said JFET and said positive input terminal;
    d) a rectifier diode coupled between said inductor and said JFET and said negative output terminal, and
    e) a control circuit for switching said JFET.

6. A boost converter circuit according to claim 5 wherein said negative input terminal is connected to said negative output terminal to form a common ground.

7. A boost converter circuit according to claim 5 wherein the gate of said JFET is coupled to said control circuit.

8. A boost converter circuit according to claim 5 wherein said control circuit is for switching said JFET between a current blocking state and a current conducting state.

9. A boost converter circuit according to claim 5 wherein said control circuit is for determining the frequency at which said JFET is switched between a current blocking state and a current conducting state.

10. A boost converter circuit according to claim 5 further comprising a capacitor connected between said positive output terminal and said negative output terminal.

11. A boost converter circuit according to claim 5 further comprising a starter device connected between said source lead and said drain lead of said JFET.

12. A boost converter circuit according to claim 5 further comprising a current limiting device connected in series between said gate lead of said JFET and said control circuit.

13. A boost converter circuit comprising:
    a) a two-port network comprising a positive input terminal; a positive output terminal, and a negative terminal common to the input and the output;
    b) an enhancement mode n-channel Junction Field Effect Transistor (JFET) coupled with source and drain between said negative terminal and an inductor;
    c) said inductor coupled between said n-channel JFET and said positive input terminal;
    d) an enhancement mode p-channel JFET coupled with source and drain between said inductor and said n-channel JFET and said positive output terminal, and
    e) a control circuit for switching said JFETs.

14. A boost converter circuit according to claim 13 wherein said negative input terminal is connected to said negative output terminal to form a common ground.

15. A boost converter circuit according to claim 13 wherein said control circuit is for holding said n-channel JFET in a current blocking state while said p-channel JFET is held in a current conducting state.

16. A boost converter circuit according to claim 13 wherein said control circuit is for holding said p-channel JFET in a current blocking state while said n-channel JFET is held in a current conducting state.

17. A boost converter circuit according to claim 13 wherein said control circuit is for determining the frequency at which said n-channel JFET and said p-channel JFET are switched between a current blocking state and a current conducting state.

18. A boost converter circuit according to claim 13 further comprising a capacitor connected between said positive output terminal and said negative output terminal.

19. A boost converter circuit according to claim 13 wherein said n-channel JFET is replaced with a p-channel JFET and said p-channel JFET is replaced with an n-channel JFET.

* * * * *